(12) United States Patent
Andres et al.

(10) Patent No.: US 7,157,386 B2
(45) Date of Patent: Jan. 2, 2007

(54) PHOTORESIST APPLICATION OVER HYDROPHOBIC SURFACES

(75) Inventors: Paul L. Andres, Dallas, TX (US); Adrian Salinas, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/981,880

(22) Filed: Nov. 5, 2004

(65) Prior Publication Data
US 2006/0099829 A1    May 11, 2006

(51) Int. Cl.
*H01L 21/31* (2006.01)
*H01L 21/469* (2006.01)

(52) U.S. Cl. ........................ 438/782; 438/907

(58) Field of Classification Search ........ 438/782, 438/784, 786, 907, 974
See application file for complete search history.

(56) References Cited
U.S. PATENT DOCUMENTS

| | | | | |
|---|---|---|---|---|
| 5,066,616 A | * | 11/1991 | Gordon | 430/272.1 |
| 5,150,176 A | * | 9/1992 | Schoenberg | 357/13 |
| 5,773,083 A | * | 6/1998 | Fischer et al. | 427/240 |
| 5,891,749 A | * | 4/1999 | Park | 438/38 |
| 6,099,662 A | * | 8/2000 | Wang et al. | 134/26 |
| 6,641,986 B1 | * | 11/2003 | Zhang et al. | 430/325 |
| 6,884,462 B1 | * | 4/2005 | Whitman | 427/240 |
| 2004/0072450 A1 | * | 4/2004 | Collins et al. | 438/782 |

OTHER PUBLICATIONS

Ping Jiang, et al. "Plasma Treatment for Silicon-Based Dielectrics" U.S. Appl. No. 10/843,957, filed May 11, 2004.

* cited by examiner

*Primary Examiner*—Phuc T. Dang
(74) *Attorney, Agent, or Firm*—Rose Alyssa Keagy; W. James Brady; Frederick J. Telecky, Jr.

(57) ABSTRACT

A method of forming a layer of photoresist 28 over a surface 30 of a semiconductor wafer 10 by forming a layer of pre-wet solvent 52 over the surface 30 and forming the layer of photoresist 28 over the layer of pre-wet solvent 52. Also, a layer of photoresist 28 formed by this method.

23 Claims, 9 Drawing Sheets

PHOTORESIST APPLICATION OVER HYDROPHOBIC SURFACES

BACKGROUND OF THE INVENTION

This invention relates to the application of photoresist over a hydrophobic surface of a semiconductor wafer.

DETAILED DESCRIPTION OF THE INVENTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
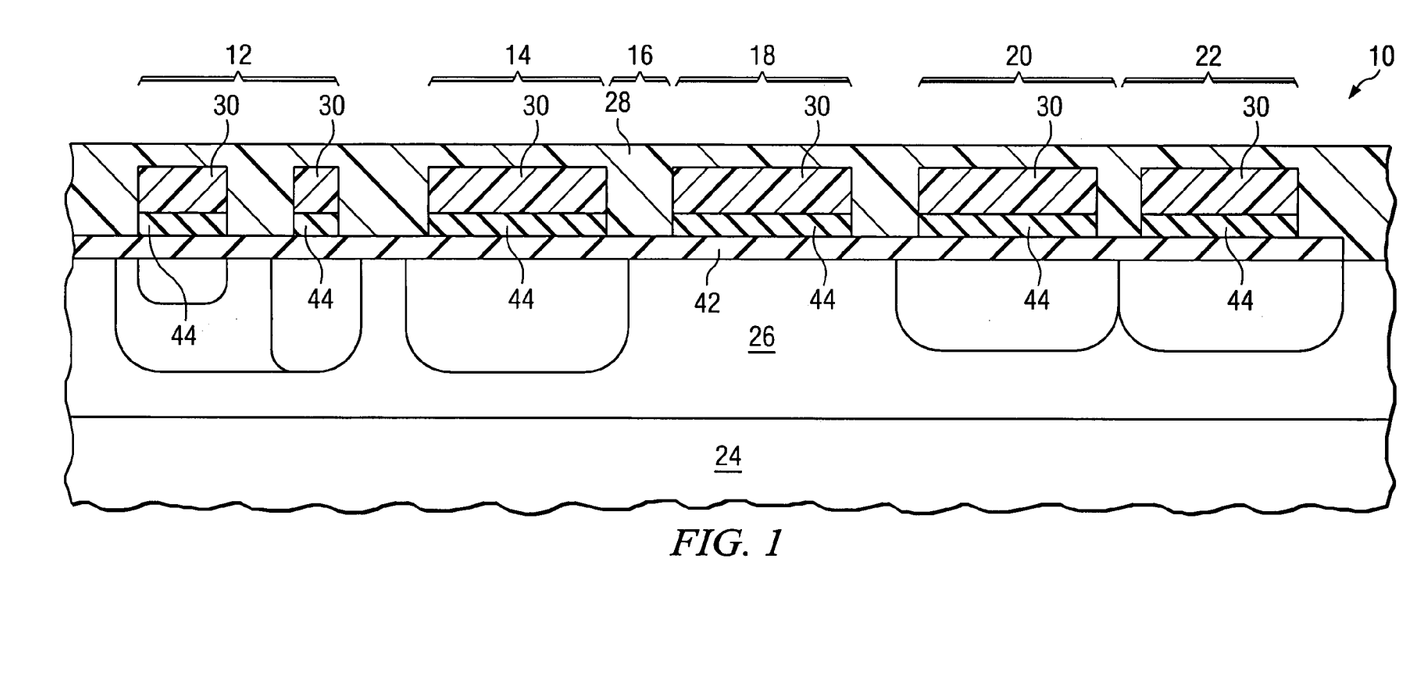
FIG. 1 is a cross-sectional view of a partially fabricated semiconductor wafer in accordance with the present invention.

Referring to the drawings, FIG. 1 is a cross-sectional view of a partially fabricated semiconductor wafer 10 in accordance with the present invention. The example application of the present invention is a Linear BiCMOS ("LBC") circuit; therefore, bipolar transistors and analog circuits are integrated on the same semiconductor wafer 10 as digital logic. More specifically, when the fabrication of the example semiconductor wafer 10 is complete an npn common collector transistor will be formed in area 12, a p-channel MOSFET ("PMOS") transistor will be formed in area 14, a MOS capacitor will be formed in area 16, and an n-channel MOSFET ("NMOS") transistor will be formed in area 18. The digital components will be a PMOS transistor formed in area 20 and a NMOS transistor formed in area 22. However, it is within the scope of the invention to form any other suitable circuit components, such as bipolar diodes, zener diodes, resistors, and junction capacitors.

The semiconductor substrate 24 is a single crystal substrate having a p-doped epitaxial silicon layer 26. However, other semiconductors such as GaAs (gallium arsenide), SOS (silicon on sapphire), and lnP (indium phosphorous) may be used. In addition, a DUF (diffusion under film) layer (not shown) may be formed between the substrate 24 and the epitaxial layer 26 in selected locations to increase the saturation point of the overlying transistor.

At the stage of wafer manufacturing shown in FIG. 1, a layer of photoresist has just been formed over the semiconductor wafer 10. This layer of photoresist is the channel stop photoresist 28. In accordance with the invention, the channel stop photoresist 28 is formed by a process (described below) that assists in its formation over high topography features and hydrophobic surfaces such as the moat photoresist layer 30.

Figure 2A:
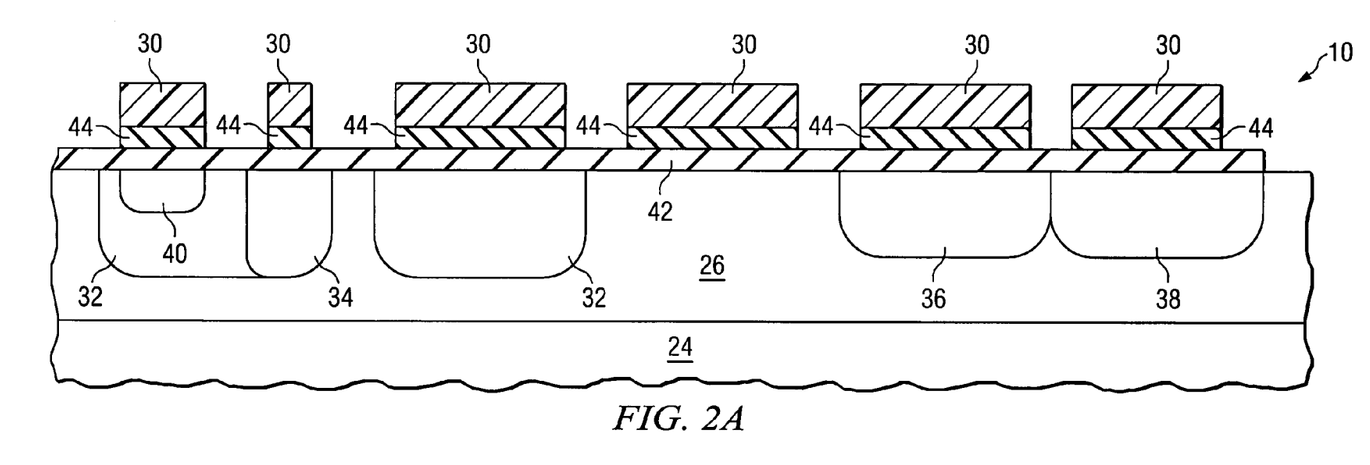
FIGS. 2A–2B are cross-sectional diagrams of a semiconductor wafer showing a process for forming a layer of photoresist in accordance with the present invention.

FIGS. 2A–3F are cross-sectional diagrams of a process for forming a layer of photoresist 28 (i.e. as shown in FIG. 1) in accordance with the present invention. FIG. 2A shows the semiconductor wafer 10 at a stage just prior to the implantation of n dopants (i.e. boron) into the isolation channel regions of the semiconductor wafer 10. The process steps for manufacturing the semiconductor wafer 10 at this point in the fabrication process are those standard in the industry. In general, the manufacturing process involves growing an epitaxial silicon layer 26 on a single-crystal substrate 24 and then using an implantation process to form the deep n-wells 32, the heavily doped collector 34, the shallow n-well 36, the shallow p-well 38, and the base 40. Next, a layer of nitride 44 is deposited over a previously grown screening oxide 42. The moat photoresist layer 30 is formed and patterned over the nitride layer 44 to open the areas of the nitride layer 44 that will be removed by the etch stop. Both the moat photoresist layer 30 and the nitride layer 44 are etched to form the structures that facilitate the n-channel implant, as shown in FIG. 2A.

In the example application, the moat photoresist 30 is Shipley 3612. However, other suitable photoresist materials may be used. In the typical manufacturing process flow, the moat photoresist 30 is applied using any suitable process and then the moat photoresist 30 is patterned by a lithography process. Next, the moat photoresist layer 30 is etched with any suitable anisotropic etch process such as RIE (reactive ion etch). Then the entire wafer 10 is subjected to a UV (ultra violet) bake to harden the moat photoresist layer 30. In general, the remaining moat photoresist structures 30 will protect the active areas of the wafer and also expose the isolation regions of the wafer during the next implant step.

It is to be noted that the UV bake, the resist etch, and/or the resist implantation process will cause the exposed surfaces of the moat photoresist structures 30 to be hydrophobic. It is also to be noted that the formation of the moat photoresist layer 30 over the nitride layer 44 can result in comparatively high topography features (i.e. 1.5 μm) throughout the semiconductor wafer 10.

Figure 2B:
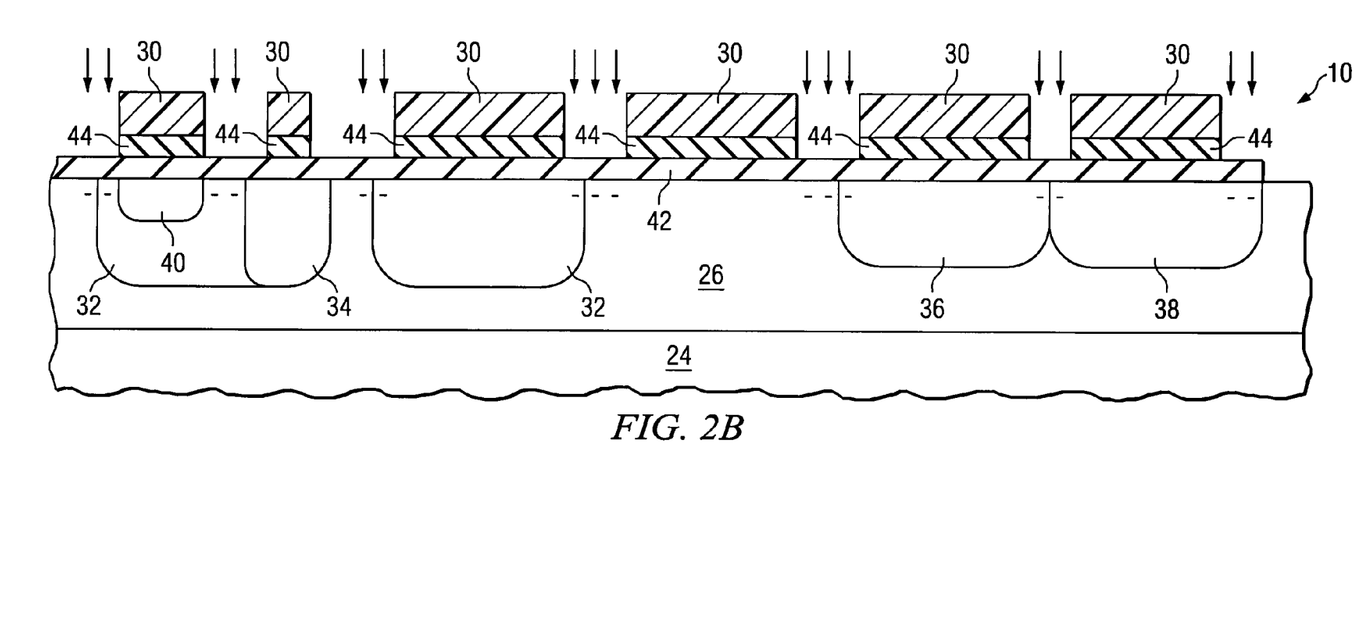

In the next step of the manufacturing process, shown in FIG. 2B, the patterned nitride 44 and moat photoresist 30 features serve as a template for the implantation of the n-channel stop. In the example application, phosphorous is now delivered (using an ion implantation process) into the isolation regions of the semiconductor wafer.

Figure 3A:
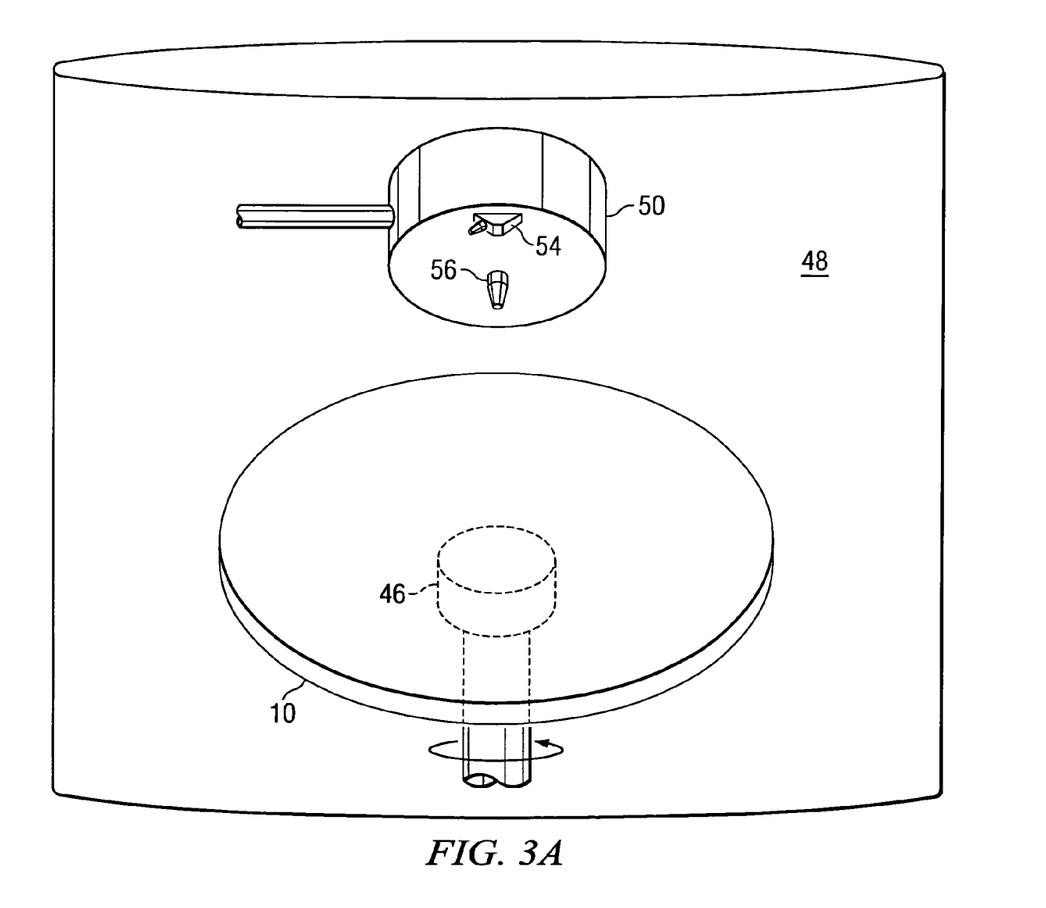
FIGS. 3A–3F are cross-sectional diagrams of a photoresist coater/developer machine containing a semiconductor wafer and showing a process for forming a layer of photoresist in accordance with the present invention.

In accordance with the invention, another photoresist layer—the channel stop photoresist layer 28—is formed over the semiconductor wafer 10 in preparation for the p-channel stop implantation. The formation of the channel stop photoresist layer 28 begins with the placement of the semiconductor wafer 10 onto a chuck 46 that is located within a photoresist coater/developer machine 48, as shown in FIG. 3A. The photoresist coater/developer machine 48 may be any suitable machine, such as a Polaris P2000 series machine (sold by FSI).

The chuck 46 temperature controls the wafer to the desired set point temperature. In the example application the wafer temperature is preferably 22.5° C. but it may range between 22.0–23.0° C. The chuck 46 also spins the semiconductor wafer 10 at an initial speed of approximately 50 rpm (revolutions per minute).

Figure 3B:
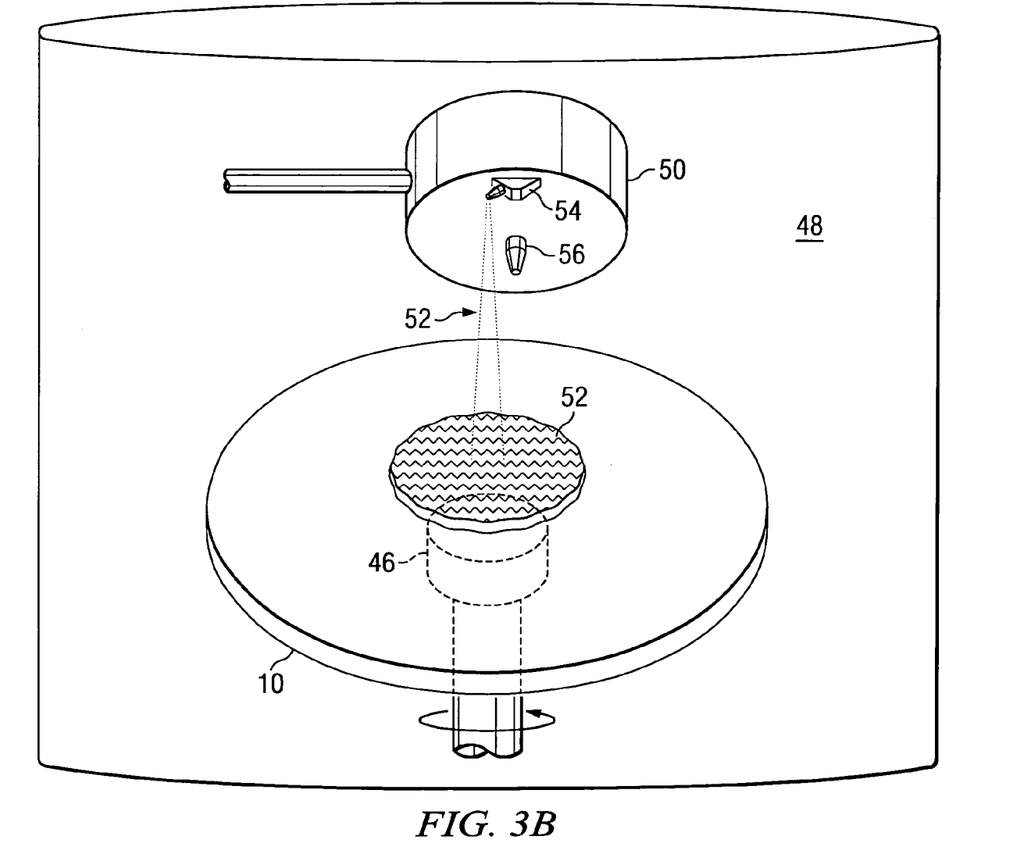

As shown in FIG. 3B, the dispense head 50 of the photoresist coater/developer machine 48 dispenses pre-wet solvent 52 through the solvent dispense nozzle 54 of the dispense head 50 onto the semiconductor wafer 10 while the semiconductor wafer 10 continues to spin at 50 rpm. In the example application, the pre-wet solvent is an EBR (Edge Bead Removal) solvent such as PGMEA (sold by Rohm & Haas); however any suitable pre-wet solvent may be used. The pre-wet solvent is maintained at the same temperature as the semiconductor wafer 10; namely, at a temperature between 22.0–23.0° C., but preferably at 22.5° C. In the example application shown in FIG. 3B, the pre-wet solvent 52 is initially deposited in a center location of the semiconductor wafer 10. However, it is within the scope of the invention to start the deposition of pre-wet solvent at any location on the semiconductor wafer 10.

Figure 3C:
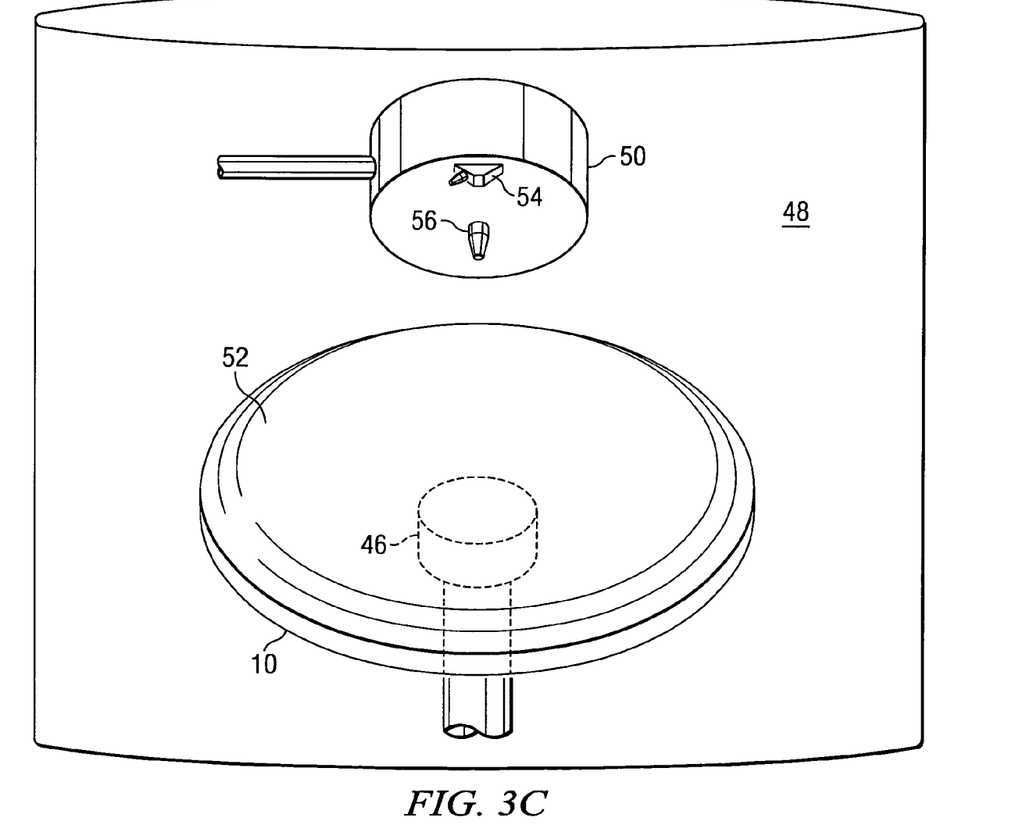

As the semiconductor wafer 10 continues to spin at 50 rpm, the dispense head 50 continues to dispense pre-wet solvent onto the semiconductor wafer 10 while moving at a very slow speed (i.e. approximately 1 pulse per second) to an edge location of the semiconductor wafer 10. When the dispense head reaches the edge location of the semiconductor wafer, a complete layer of pre-wet solvent 52 will be formed over the semiconductor wafer 10 and the solvent dispense nozzle 54 will shut off. After the solvent dispenser shuts off, the chuck 46 will stop spinning the semiconductor wafer 10 and the dispense head 50 will return at a speed between 200–625 pps, but preferably 325 pps, to a location over the center of the semiconductor wafer 10, as shown in FIG. 3C. The total amount of pre-wet solvent dispensed onto the surface of the semiconductor wafer 10 in this example application (i.e. for a 200 mm wafer) is approximately 6–12 cc.

Figure 3D:
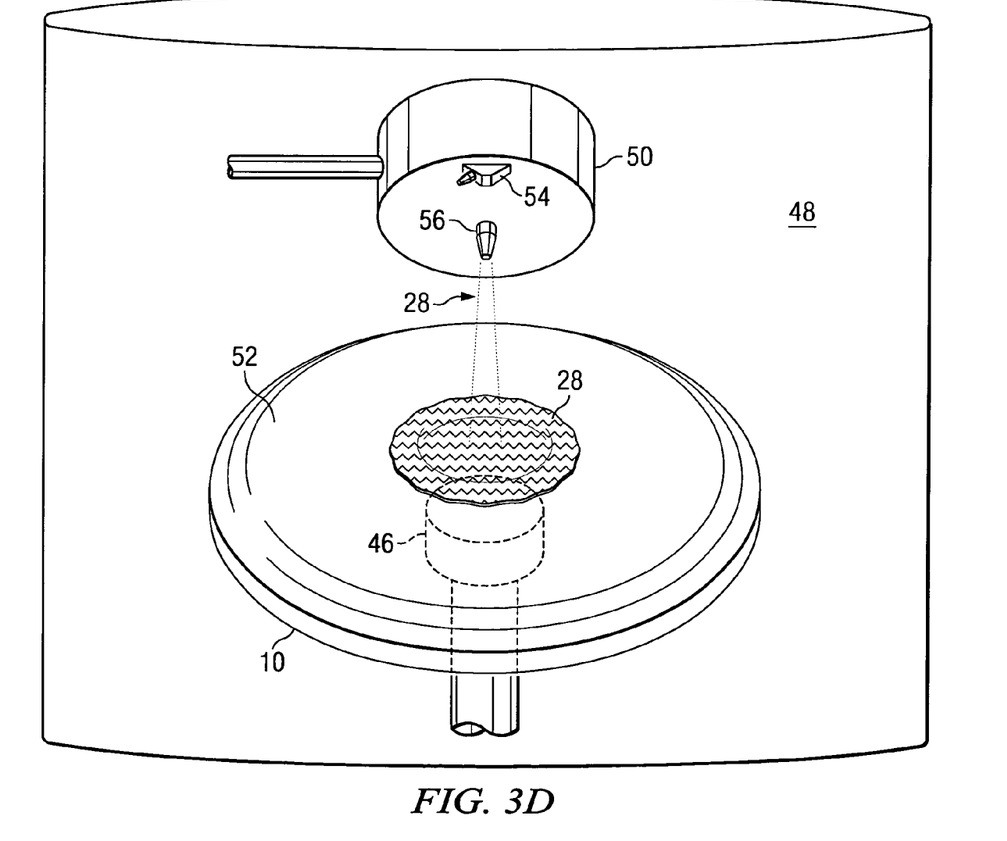

Now a photoresist dispenser 56 (which is also located within the dispense head 50) dispenses photoresist 28 onto a center location of the stationary semiconductor wafer 10 (that is held in place by chuck 46), as shown in FIG. 3D. The photoresist is preferably Shipley 3617; however, it is within the scope of the invention to use any suitable photoresist 28. In addition, the photoresist 28 is dispensed at a temperature between 22.0–23.0° C., but preferably at 22.5° C. In the example application, the photoresist layer 28 is the channel stop photoresist layer 28 (shown in FIG. 1)

The semiconductor wafer 10 remains stationary for about 0.4 seconds during the deposition of the photoresist 28. However, the semiconductor wafer may be held stationary for any suitable amount of time, such as between 0.2–0.6 seconds, in order to ensure a continuous coverage of photoresist 30. Because the surface is extremely hydrophobic, this step is necessary to ensure that an air gap does not form between the two liquids (28 and 52). As shown in FIG. 3D, the pre-wet solvent 52 is displaced from the semiconductor wafer 10 as it comes into contact with the surface of the photoresist layer 28.

Figure 3E:
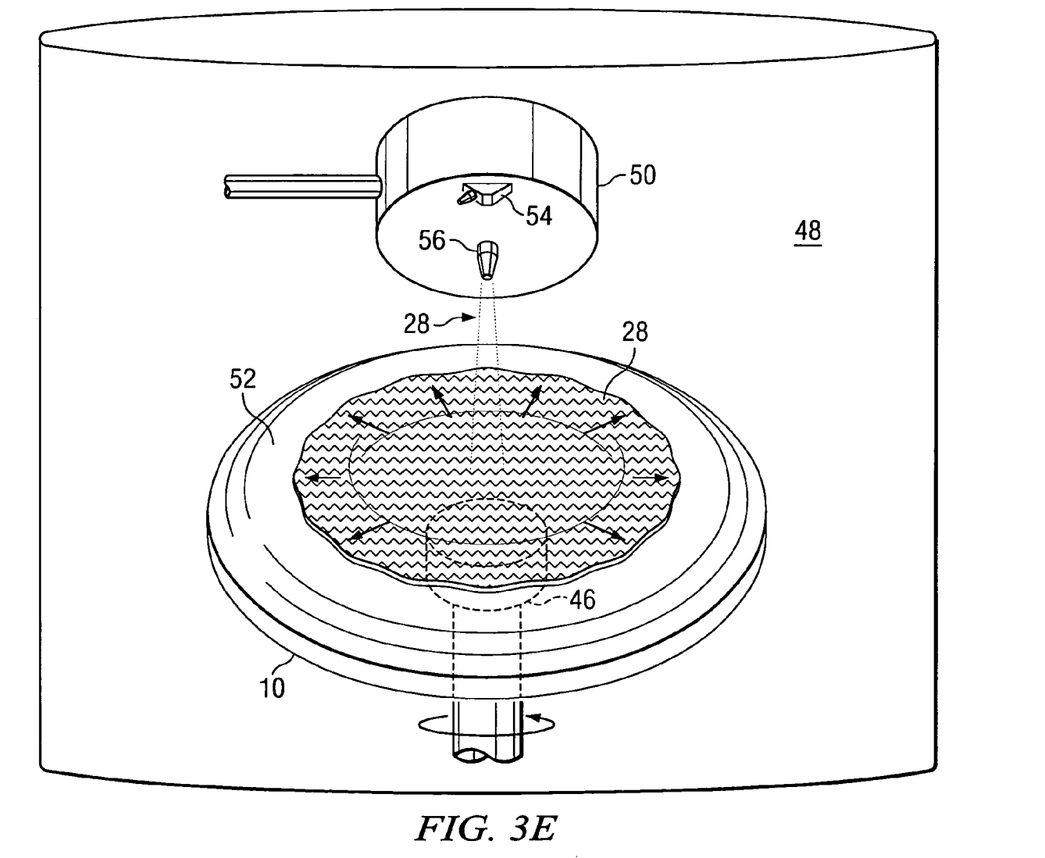

While the photoresist dispenser 56 continues to dispense the photoresist 28, the chuck 46 begins to spin the semiconductor wafer 10 at speeds between 1000–3400 rpm. (If the wafer spins too fast then the pre-wet solvent dries before the photoresist spreads to the edges of the wafer. If the wafer spins too slowly then the pre-wet solvent dries before the photoresist reaches the edge of the wafer.) The spinning action causes the photoresist layer 28 to spread from the center location of the semiconductor wafer 10 to the edge of the semiconductor wafer 10, as shown in FIG. 3E. More specifically, the spinning action causes the edges of the photoresist layer 28 to merge with the adjoining pre-wet solvent layer 52 while the photoresist layer 28 settles down to the surface of the semiconductor wafer 10 and the pre-wet solvent 52 evaporates. Therefore, the pre-wet solvent 52 is used as a surface tension reducer to allow the photoresist material 28 to cover the entire wafer 10.

Figure 3F:
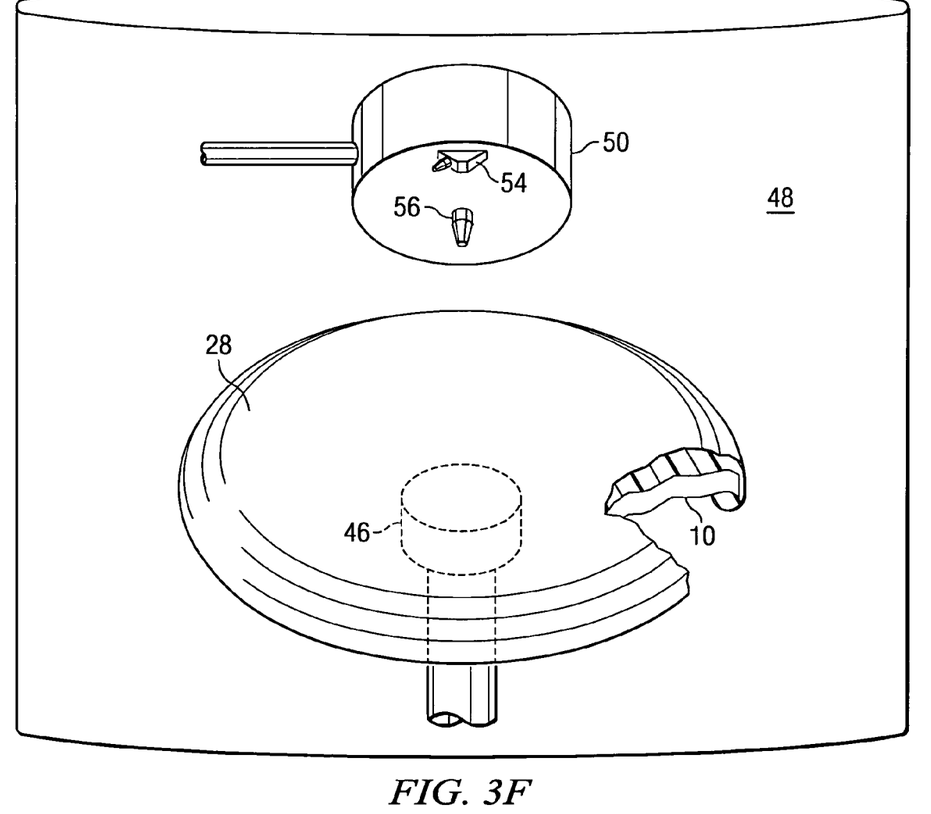

In the example application, the photoresist dispenser 56 stops dispensing photoresist 28 after about 1 second of total time (i.e. the time that photoresist is dispensed with the wafer stationary plus the time that photoresist 28 is dispensed with the wafer spinning). Therefore, the photoresist is dispensed by the photoresist dispenser 56 of the dispense head 50 while the wafer is spinning for between 0.4–0.8 seconds. Even after the deposition of the photoresist 28 has stopped, the chuck 46 will continue to spin the wafer at a speed of approximately 2690 rpm for approximately 20 more seconds. This extra spinning process is used to change the thickness of the photoresist layer 28 to the desired height and then to dry the photoresist layer 28. The chuck 46 then stops the spinning of the semiconductor wafer 10. As shown in FIG. 3F, the channel stop photoresist layer 28 is now relatively uniform across the top surface of the semiconductor wafer 10. In addition, the photoresist layer 28 will likely wrap around the outer edge of the semiconductor wafer 10. It is to be noted that approximately 1 cc of photoresist 28 will be dispensed by the photoresist dispenser 56 for the example 200 mm wafer.

Figure 4A:
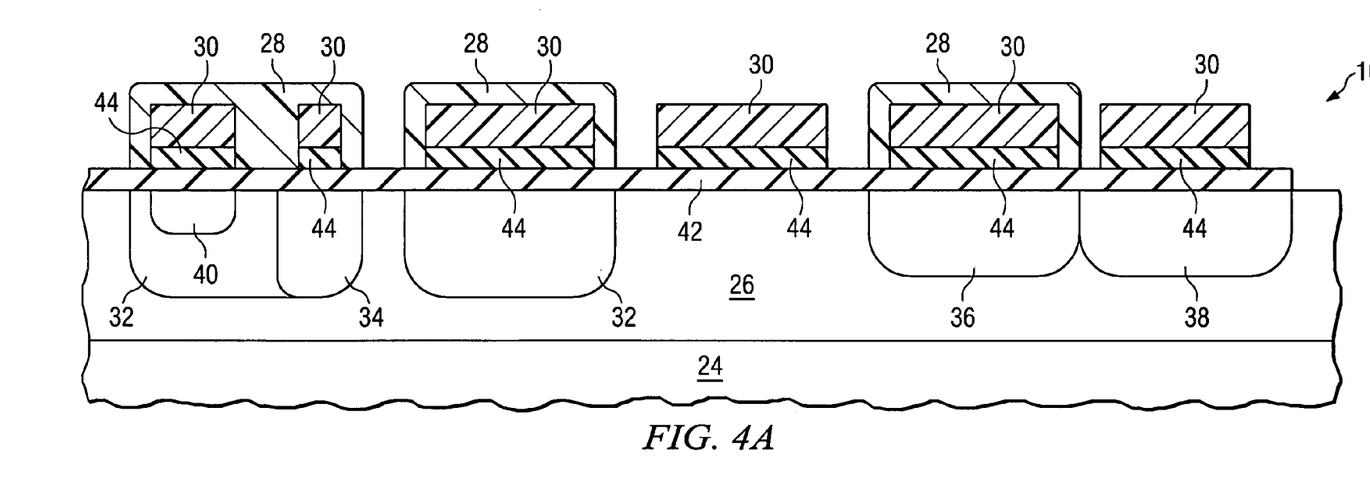
FIGS. 4A–4B are cross-sectional diagrams of a semiconductor wafer showing a process for forming a layer of photoresist in accordance with the present invention.
Figure 4B:
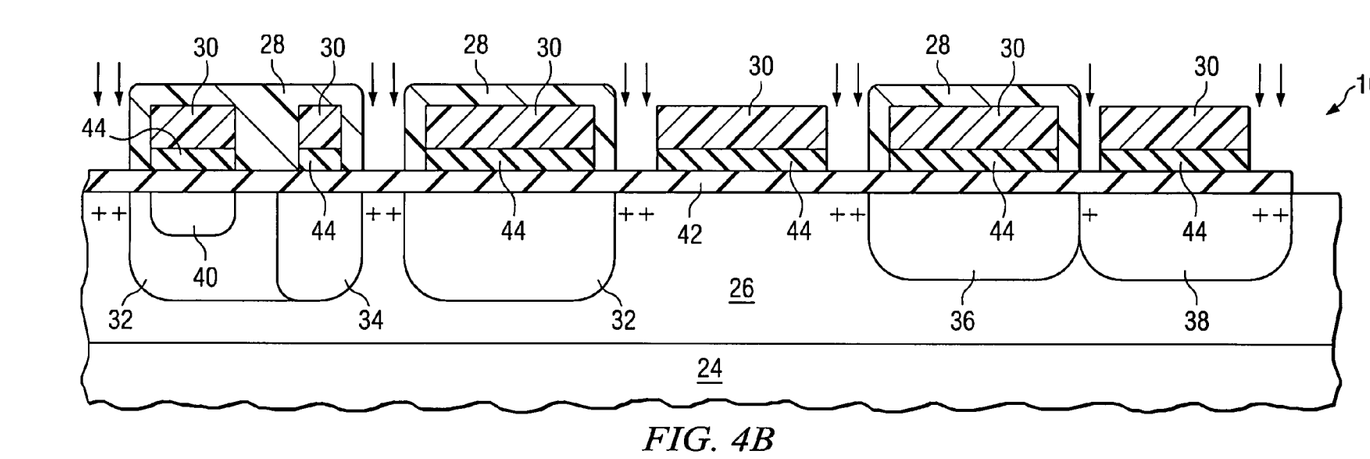

The channel stop photoresist 28 formed in accordance with the present invention easily coats high topology objects (such as the moat photoresist stack 30, 44) and has a relatively planar surface, as shown in FIG. 1. The fabrication of the semiconductor wafer 10 now continues with known manufacturing processes. For example, the next step would be a standard cleaning process to remove the edge bead from the semiconductor wafer 10—preferably using the same EBR solvent that was previously used as the pre-wet solvent 52. As shown in FIG. 4A, the next step would generally be patterning the channel stop photoresist layer 28 in preparation for the p-channel stop implant. Once the channel stop photoresist layer 28 is patterned it is used as the template for the implantation of the p-type dopants (i.e. boron) into the isolation regions of the semiconductor wafer 10, as shown in FIG. 4B. The fabrication of the semiconductor wafer 10 now continues with known manufacturing processes until the semiconductor wafer is complete, the wafer sliced, and each die packaged.

Various additional modifications to the invention as described above are within the scope of the claimed invention. As an example, instead of applying the pre-wet solvent by starting at the center of the wafer and then moving to the edge of the wafer, the solvent may be applied in any manner which results in the formation of a solid layer of pre-wet solvent over the semiconductor wafer. Similarly, the photoresist layer 28 may be applied to the semiconductor wafer by the photoresist dispenser 56 at any location on the wafer, as long as a solid photoresist layer is formed.

Instead of forming a channel stop photoresist layer, the present invention may be used to form a photoresist layer at any stage in the semiconductor fabrication process. For example, the photoresist layer 28 may be formed over other hydrophobic layers such as the metal interconnect features in the back-end of the integrated circuit, the PO (protective overcoat) capping layer of the integrated circuit, or used in a back grind protection application. Moreover, this invention is compatible with linear, digital and mixed signal integrated circuits and it may be implemented in various semiconductor technologies, such as bipolar, SOI, CMOS, strained silicon and SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for forming a second layer of photoresist over a semiconductor wafer, comprising:
   forming a layer of pre-wet solvent over a surface of said semiconductor wafer, said surface containing at least one feature having a feature surface comprised of a first layer of photoresist; and
   forming said second layer of photoresist over said layer of pre-wet solvent.

2. The method of claim 1 wherein said first layer of photoresist is a moat photoresist.

3. The method of claim 1 wherein said pre-wet solvent is an EBR.

4. The method of claim 1 wherein said second layer of photoresist is a channel stop photoresist layer.

5. The method of claim 1 wherein said step of forming a layer of pre-wet solvent comprises:
   spinning said semiconductor wafer on a chuck located within in a photoresist coater/developer machine;
   dispensing said pre-wet solvent from a dispense head that is suspended over said semiconductor wafer, said dispense head moving from a center location of said semiconductor wafer to an edge location of said semiconductor wafer;
   stopping said dispensing of said pre-wet solvent;
   stopping said spinning of said semiconductor wafer; and
   moving said dispense head to a center location of said semiconductor wafer.

6. The method of claim 5 wherein said spinning step includes spinning said semiconductor wafer at a speed of approximately 50 rpm.

7. The method of claim 5 wherein said dispensing step includes dispensing between 6–12 cc of said pre-wet solvent.

8. The method of claim 5 wherein said dispense head moves from said center location to said edge location at a speed of approximately 1 pps.

9. The method of claim 5 wherein said step of moving said dispense head to a center location of said semiconductor wafer includes moving said dispensing head at a speed of between 200–625 pps.

10. The method of claim 1 wherein said step of forming a layer of pre-wet solvent includes maintaining said semiconductor wafer and said pre-wet solvent at a temperature between 22–23° C.

11. The method of claim 1 wherein said step of forming said second layer of photoresist includes maintaining said semiconductor wafer and said second layer of photoresist at a temperature between 22–23° C.

12. The method of claim 1 wherein said step of forming said second layer of photoresist comprises:
   suspending said semiconductor wafer on a chuck that is located within in a photoresist coater/developer machine while dispensing photoresist from a dispense head that is suspended over a center location of said semiconductor wafer;
   spinning said semiconductor wafer with said chuck and continuing to dispense said photoresist from said dispense head; and
   stopping said dispensing of said photoresist.

13. The method of claim 12 further comprising the step of stopping said spinning of said semiconductor wafer when said second layer of photoresist is dry.

14. The method of claim 12 wherein a duration of said suspending step is between 0.2–0.6 seconds.

15. The method of claim 12 wherein a duration of said spinning step is 0.4–0.8 seconds.

16. The method of claim 12 wherein approximately 1 cc of said photoresist is dispensed from said dispense head.

17. A second layer of photoresist formed in accordance with the method of claim 1.

18. A channel stop photoresist layer formed in accordance with the method of claim 1.

19. A method of forming a layer of channel stop photoresist over a hydrophobic moat photoresist layer of a semiconductor wafer comprising:
   forming a layer of EBR pre-wet solvent over said hydrophobic moat photoresist layer; and
   forming said layer of channel stop photoresist through the displacement of said layer of EBR pre-wet solvent.

20. The method of claim 19 wherein said semiconductor wafer, said EBR pre-wet solvent and said channel stop photoresist are maintained at a temperature between 22.0–23.0° C.

21. A channel stop photoresist layer formed in accordance with the method of claim 19.

22. The method of claim 1 wherein said at least one feature has a minimum height of 1.5 µm.

23. The method of claim 1 wherein said second layer of photoresist contacts said first layer of photoresist.

* * * * *